United States Patent
Horng

(10) Patent No.: US 6,359,215 B1
(45) Date of Patent: Mar. 19, 2002

(54) ELASTOMER DEVICE FOR PREVENTING ELECTROMAGNETIC INTERFERENCE OF A COMPUTER CENTRAL PROCESSING UNIT

(76) Inventor: Chin Fu Horng, No. 9, Lane 90, Fu Hsing Rd., Lu Chou, Taipei Hsien (TW)

(*) Notice: Subject to any disclaimer, the term of this patent is extended or adjusted under 35 U.S.C. 154(b) by 0 days.

(21) Appl. No.: 09/588,318

(22) Filed: Jun. 6, 2000

(51) Int. Cl.⁷ ................................................. H05K 9/00
(52) U.S. Cl. .............................. 174/35 GC; 174/35 R; 361/818
(58) Field of Search ........................ 174/35 GC, 35 R; 361/753, 799, 800, 816, 818; 493/92, 95, 96, 609, 816, 927; 277/919, 920

(56) References Cited

U.S. PATENT DOCUMENTS

| | | | |
|---|---|---|---|
| 5,043,528 A | * 8/1991 | Mohr | ..................... 174/35 GC |
| 5,600,092 A | * 2/1997 | Patscheck et al. | ..... 174/35 GC |
| 5,672,844 A | * 9/1997 | Persson et al. | ........ 174/35 GC |
| 5,833,480 A | * 11/1998 | Austin | .......................... 439/95 |
| 5,934,916 A | * 8/1999 | Latal et al. | ..................... 439/95 |

* cited by examiner

*Primary Examiner*—Dean A. Reichard
*Assistant Examiner*—Carmelo Oliva
(74) *Attorney, Agent, or Firm*—Rosenberg, Klein & Lee

(57) ABSTRACT

An elastomer for preventing electromagnetic interruption to a computer central processing unit includes at least one elastic conductive piece. An enhancing portion is bent inwards between the second arc portion and the welding surface. The lower edge of the enhancing portion is formed with an inclined surface having a proper orientation (preferably 45 degrees). Thereby, as the elastic conductive piece is pressed downwards, it can be avoided that the combining portion of the second arc portion, welding surface and tin glue is broken.

8 Claims, 11 Drawing Sheets

ELASTOMER DEVICE FOR PREVENTING ELECTROMAGNETIC INTERFERENCE OF A COMPUTER CENTRAL PROCESSING UNIT

FIELD OF THE INVENTION

The present invention relates to an elastomer device for preventing electromagnetic interference of a computer central processing unit, and especially to an elastomer device in which an elastic conductive piece may be pressed without breaking.

BACKGROUND OF THE INVENTION

In the prior art for preventing electromagnetic interference in a computer mother board, a hollow cover is placed at the connection between the microprocessor and memory using a conductive sponge.

However, the cost of the conductive sponge is high, and manual installation is required. This increases the cost of assembly and makes the assembly work, itself, more difficult.

In another prior art approach, an elastic conductive piece is used in place of the conductive sponge in preventing electromagnetic interference. As shown in FIGS. 1 to 5, a contact surface 61 is formed in the elastic conductive piece 60. From an outer lateral side of the contact surface 61, piece 60 extends downward and bends to form a plate 62. A first arc portion R1 is thus formed between the plates 61, 62. The central portion of the first arc portion R1 is punched with a groove 64. From the two lateral sides of the first arc portion R1, piece 60 is bent downward and extended to form respective lateral plates 62. The distal end of the plates 62 extend downward to form a second arc portion R2 and a welding surface 63 extending therefrom. The inner surface of the second arc portion R2 is of opposite orientation from the inner surface of the first arc portion R1. The welding surface 63 is coupled to a computer mother board 80 with a tin glue material 70.

The elastic conductive piece 60 is generally of sufficient elasticity, conductivity, low impedance, and resistance to oxidation to yield a useful product. However, since the tin glue material 70 is an adhesive glue material, the tin glue 70 hardens to join the elastic conductive piece and the computer mother board. When the elastic conductive piece is subjected to a stress force, the stress is applied at the tin glue joint and the second arc portion of the elastic conductive piece 60, as shown by the arrow of FIG. 5. It is thus very possible that if enough force is applied to the elastic conductive piece, it will break.

Therefore, there is a need for a novel device that serves to prevent electromagnetic interference of a computer central processing unit and remedies the shortcomings of the prior art.

SUMMARY OF THE INVENTION

Accordingly, the primary object of the prevent invention is to provide an elastomer device for preventing electromagnetic interference of a computer circuit processing unit. An enhancing portion is bent inwards between a second arc portion and a welding surface such that as the elastic conductive piece is pressed downwards, breakage is avoided.

The various objects and advantages of the present invention will be more readily understood from the following detailed description when read in conjunction with the appended Drawings.

DETAILED DESCRIPTION OF THE PREFERRED EMBODIMENTS

Figure 1:
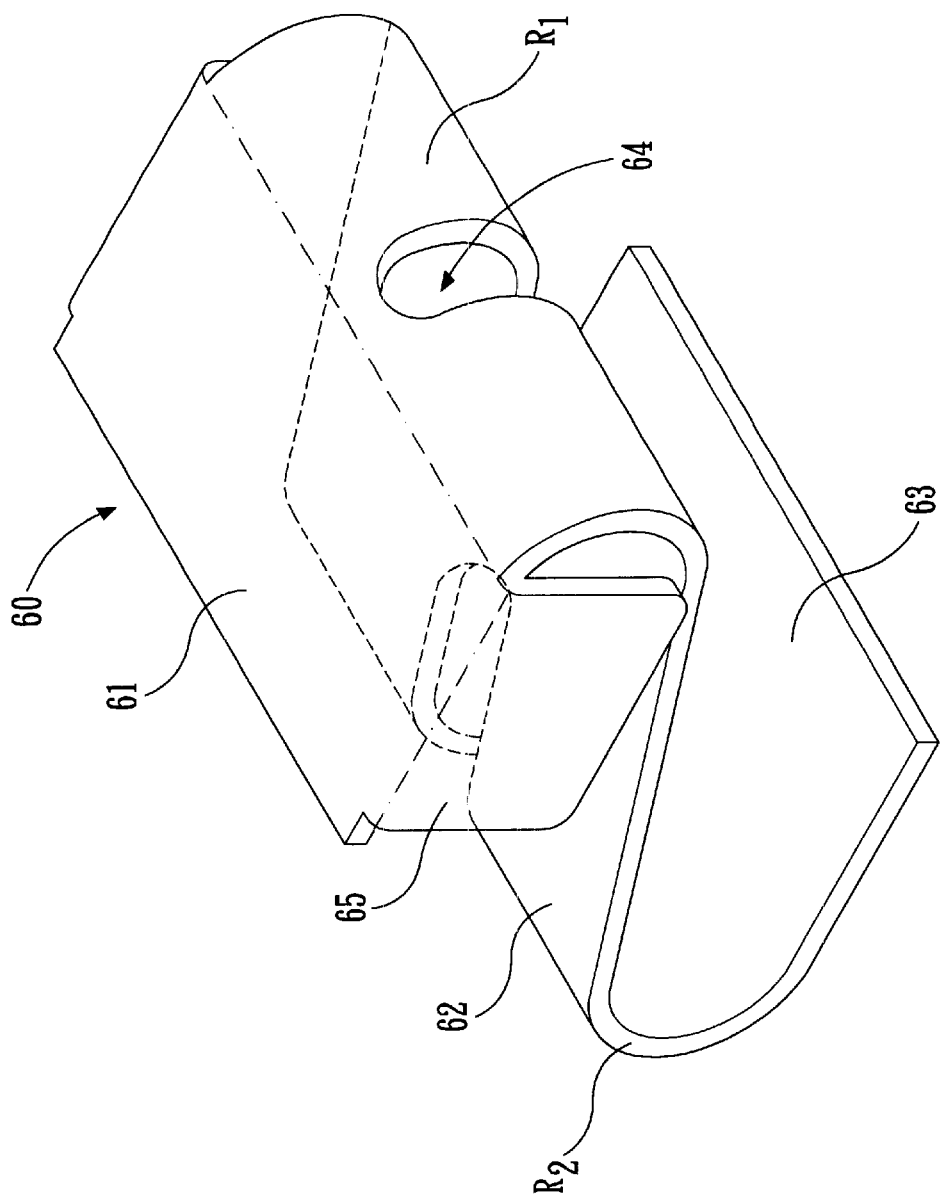
FIG. 1 is a perspective view of a prior art elastic conductive piece.
Figure 2:
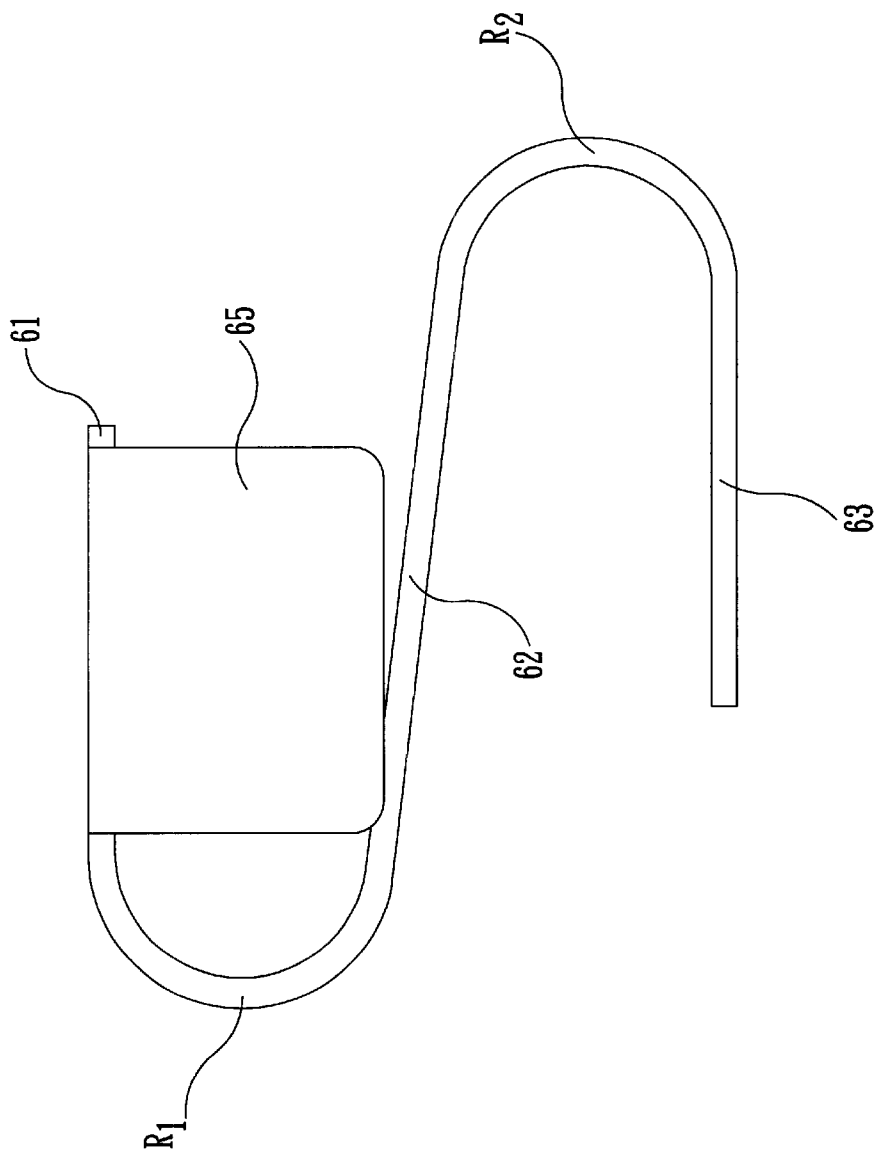
FIG. 2 is a lateral view of a prior art elastic conductive piece.
Figure 3:
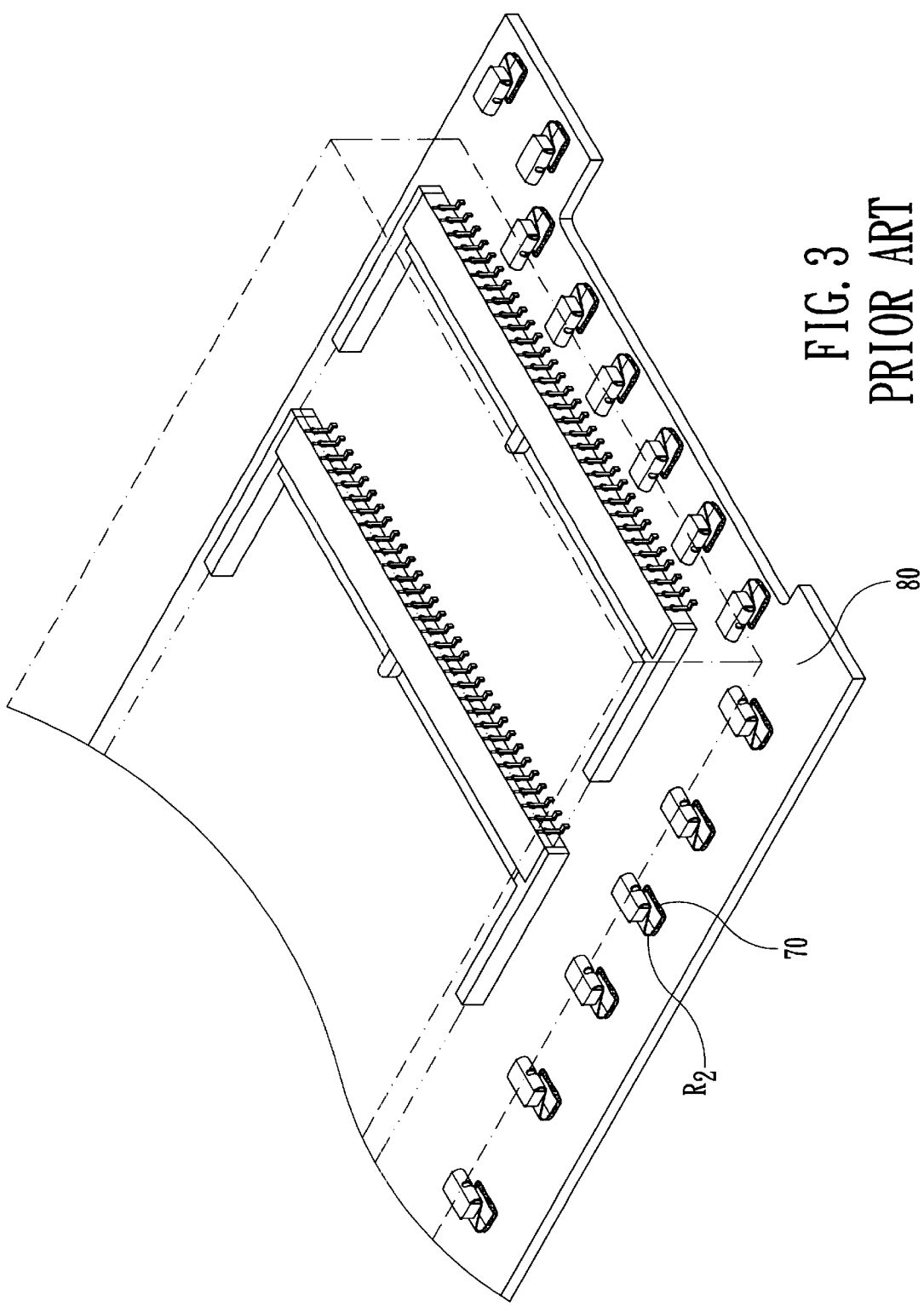
FIG. 3 shows a prior art elastic conductive piece mounted to a computer mother board.
Figure 4:
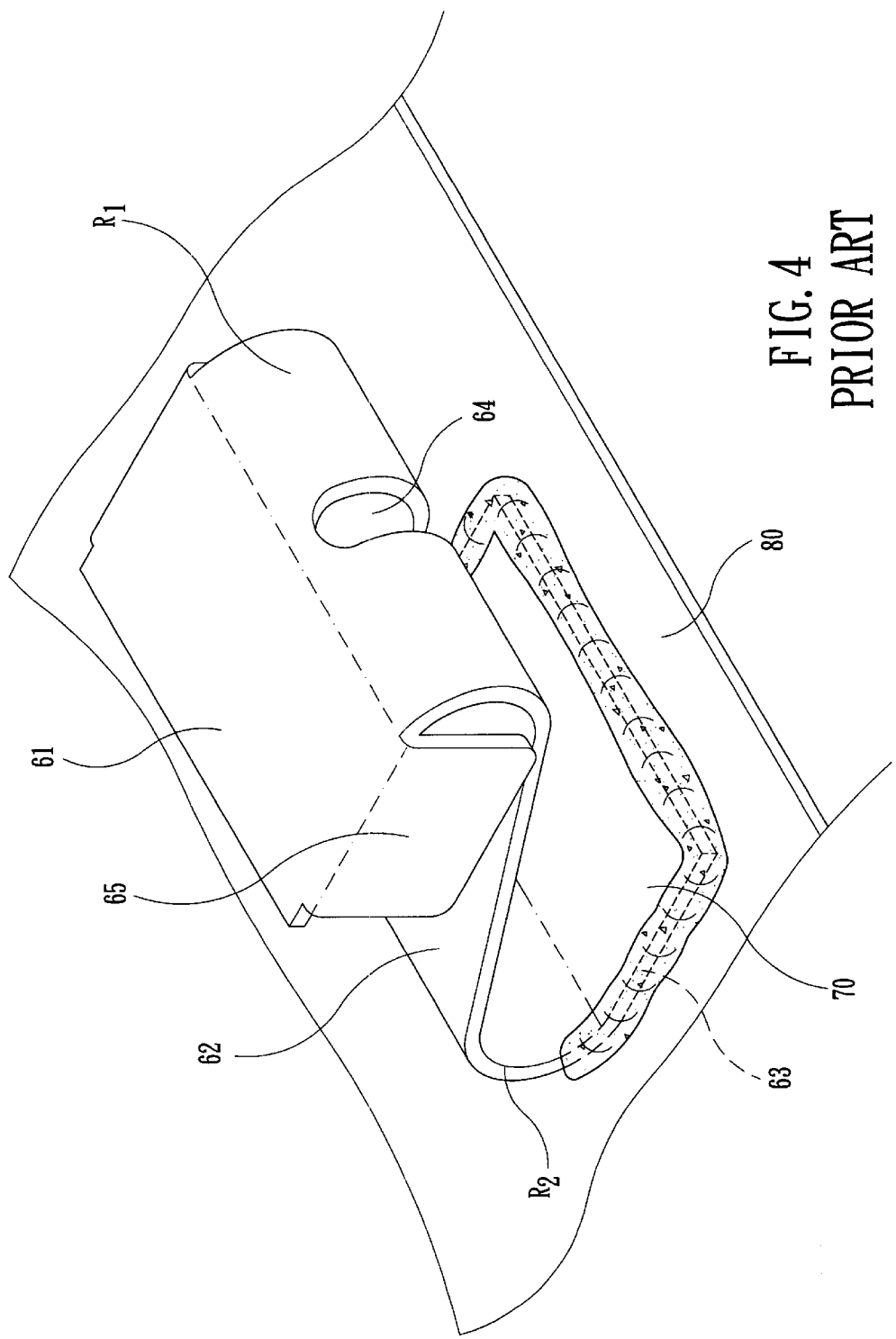
FIG. 4 is a perspective view showing a single prior art elastic conductive piece mounted to a computer mother board.
Figure 5:
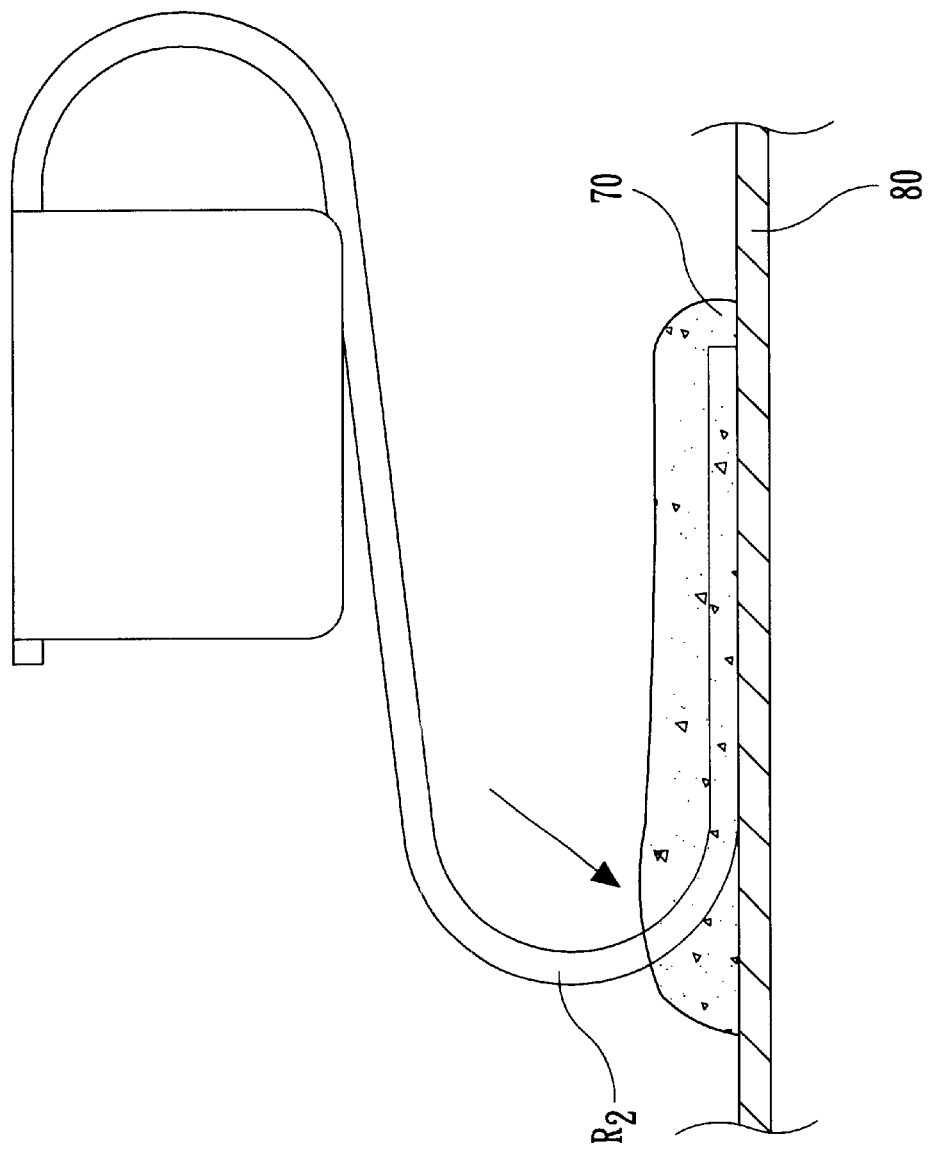
FIG. 5 is a lateral view showing a single prior art elastic conductive piece mounted to a computer mother board.
Figure 6:
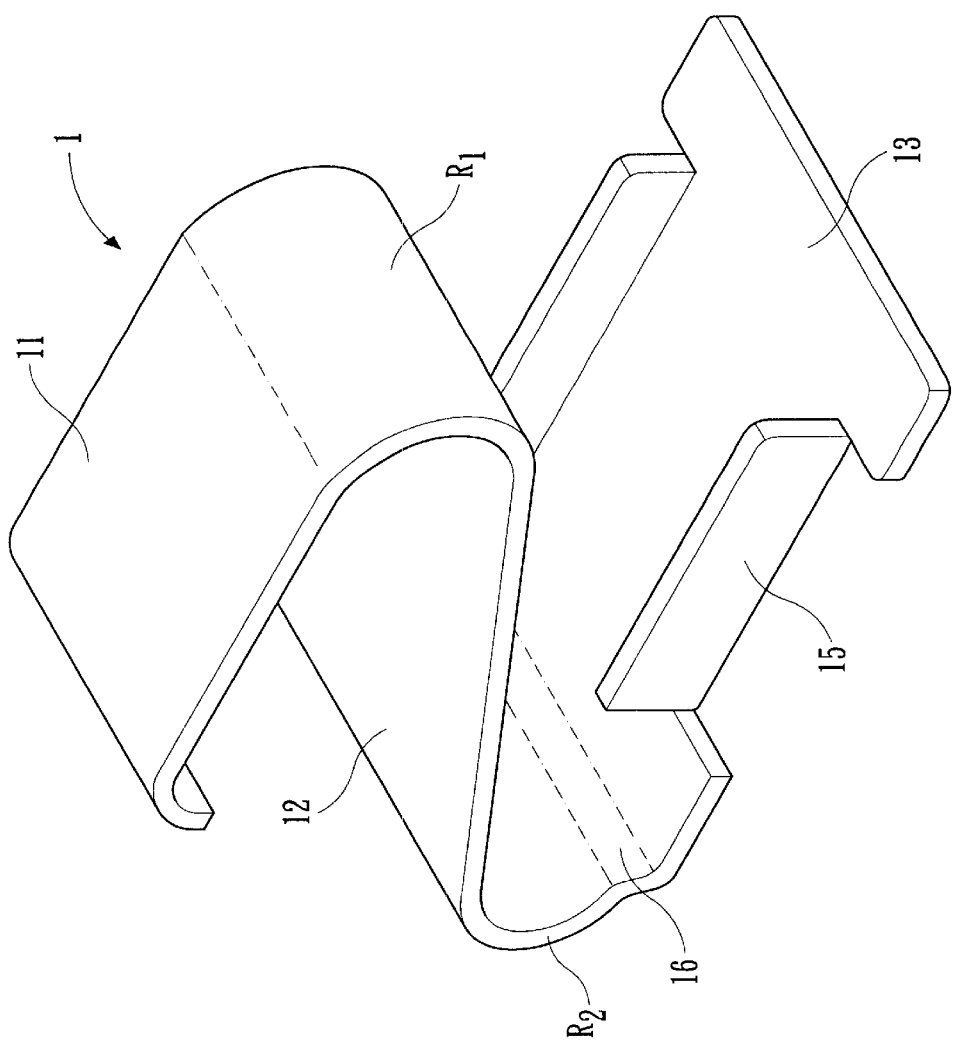
FIG. 6 is a perspective view of a single elastic conductive piece of the present invention.
Figure 7:
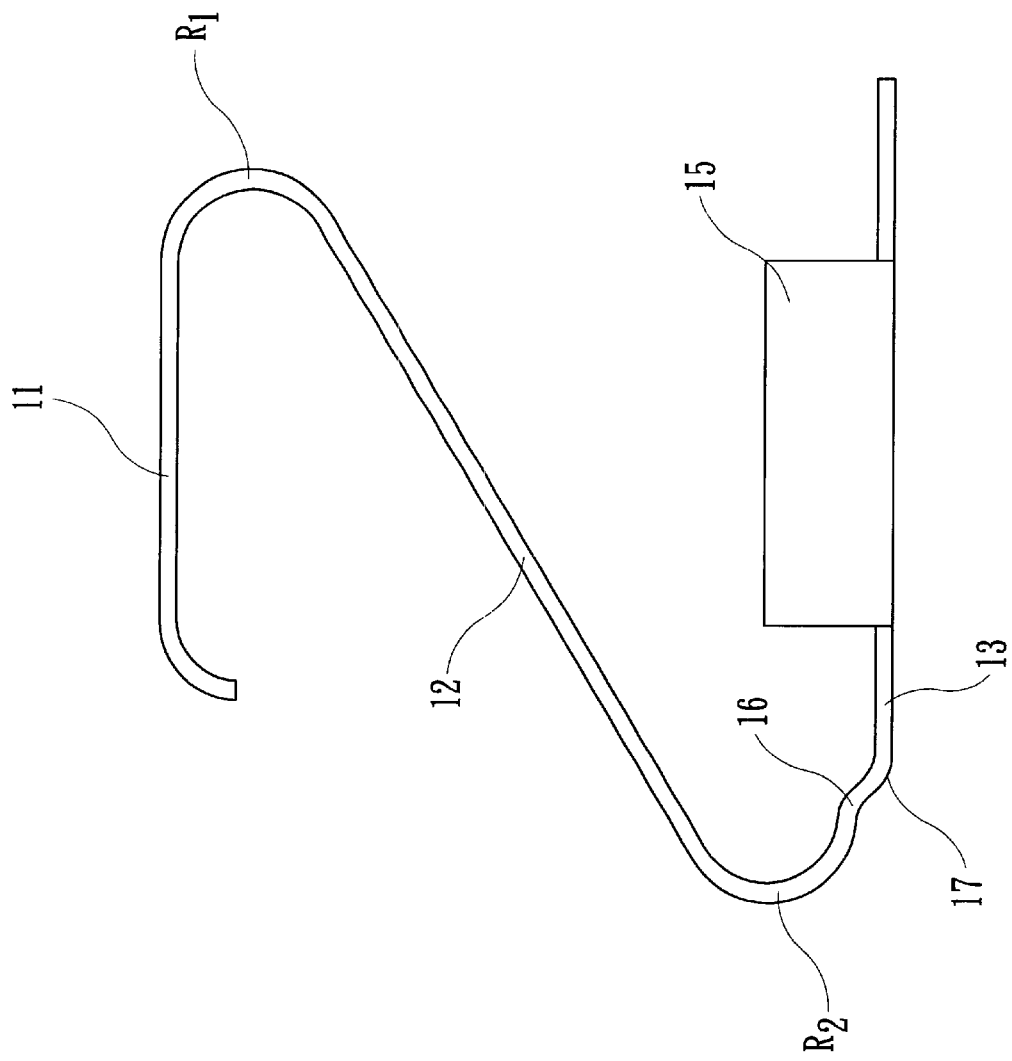
FIG. 7 is a lateral view of a single elastic conductive piece of the present invention.

In order to achieve the aforesaid objects, the configuration and effect of the present invention is described in the following paragraphs with reference to the appended Figures.

Referring to FIGS. 6–10, the elastomer device for preventing electromagnetic interference (EMI) of a computer central processing unit according to the present invention is illustrated. In the present invention, each elastic conductive piece 1 is formed with a contact surface 11 for resistively bearing against a lower edge of a cover 2. One outer end of the contact surface 11 bends downward to define a first arc portion R1 from which extends a plate 12. The distal end of the plate 12 bends downward to define a second arc portion R2 that leads to a welding surface 13. An enhancing portion 16 extends between the lower end of the second arc portion R2 and the welding surface 13. The enhancing portion 16 includes an inclined surface 17 having a predetermined slope (preferably 45 degrees). An upper part of the enhancing portion 16 is preferably spaced at rest a distance of 0.2 mm from the computer mother board 3. The inner surface of the second arc portion R2 is opposite in orientation to the inner surface of the first arc portion R1. The welding surface 13 is joined to the computer mother board 3 with a tin glue material 4. Two lateral sides of the welding surface 13 are bent upwards to form two upright lateral plates 15.

During use, as the elastic conductive piece 1 is pressed downwards, the stress generated upon the second arc portion R2, welding surface 13, and tin glue material 4 is sufficiently accommodated so as to avoid breakage or separation of the joined portions.

Figure 8:
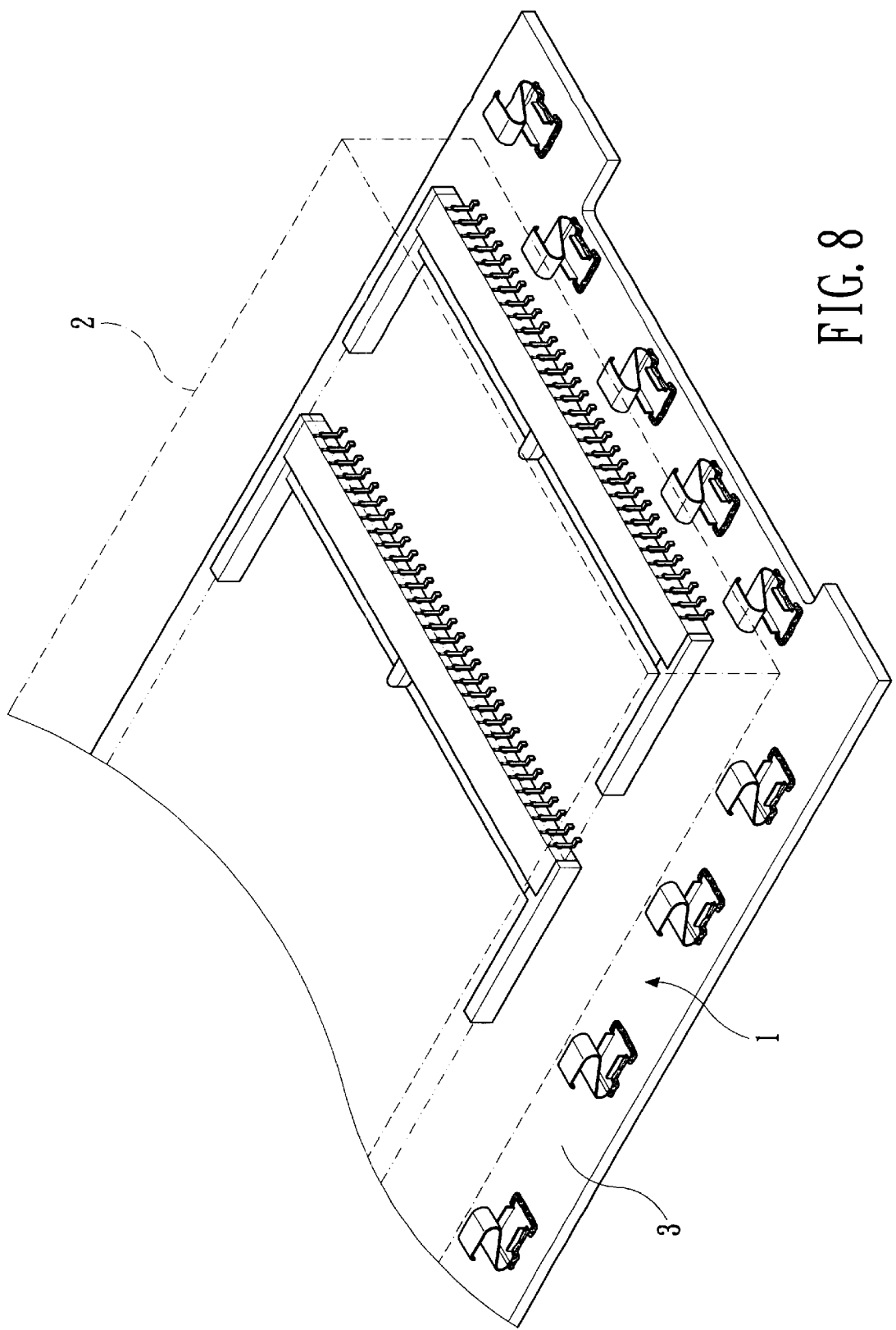
FIG. 8 shows an application of the elastic conductive piece of the present invention on a computer mother board.
Figure 9:
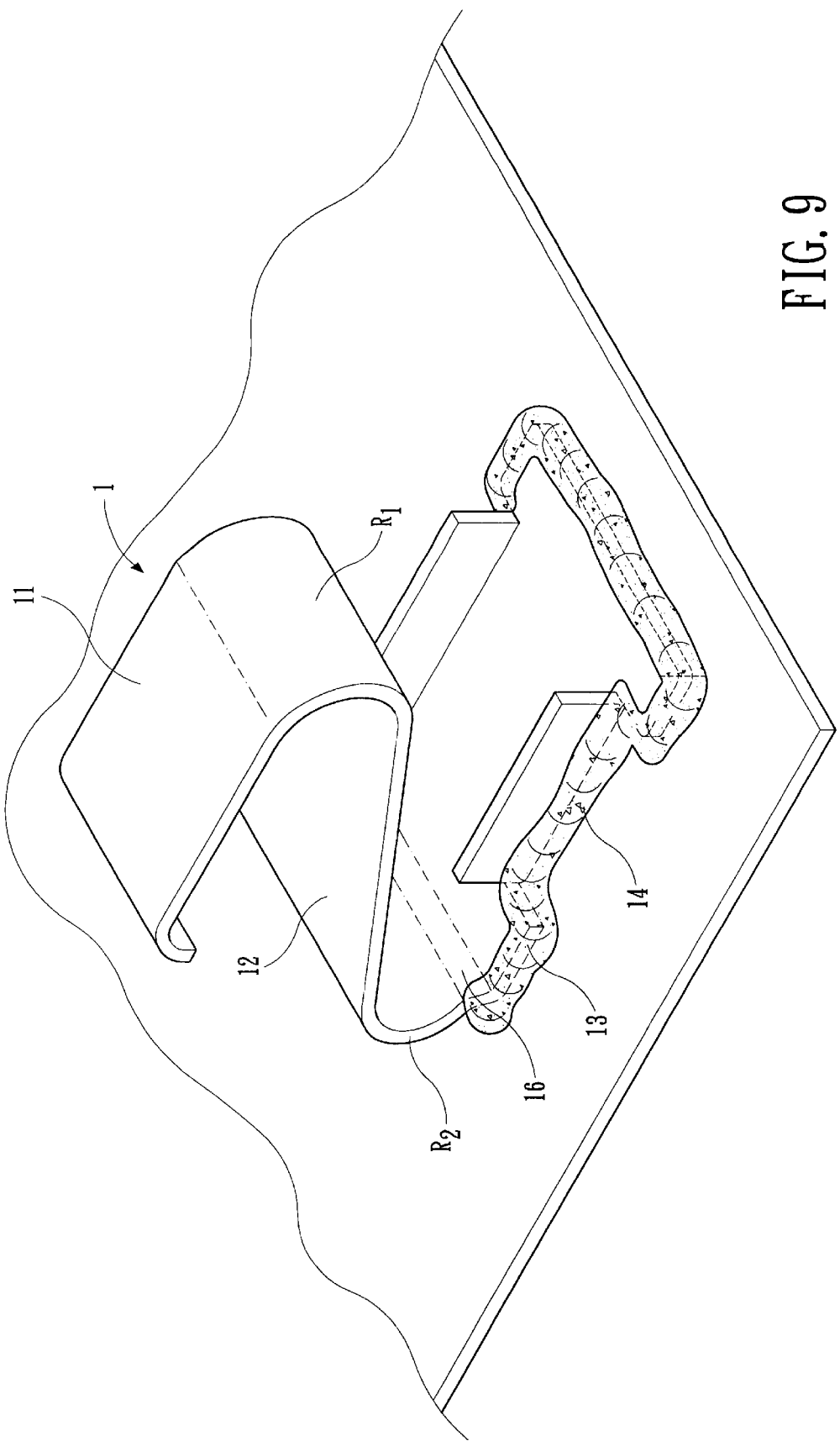
FIG. 9 is a perspective view showing a single elastic conductive piece of the present invention mounted to a computer mother board.
Figure 10:
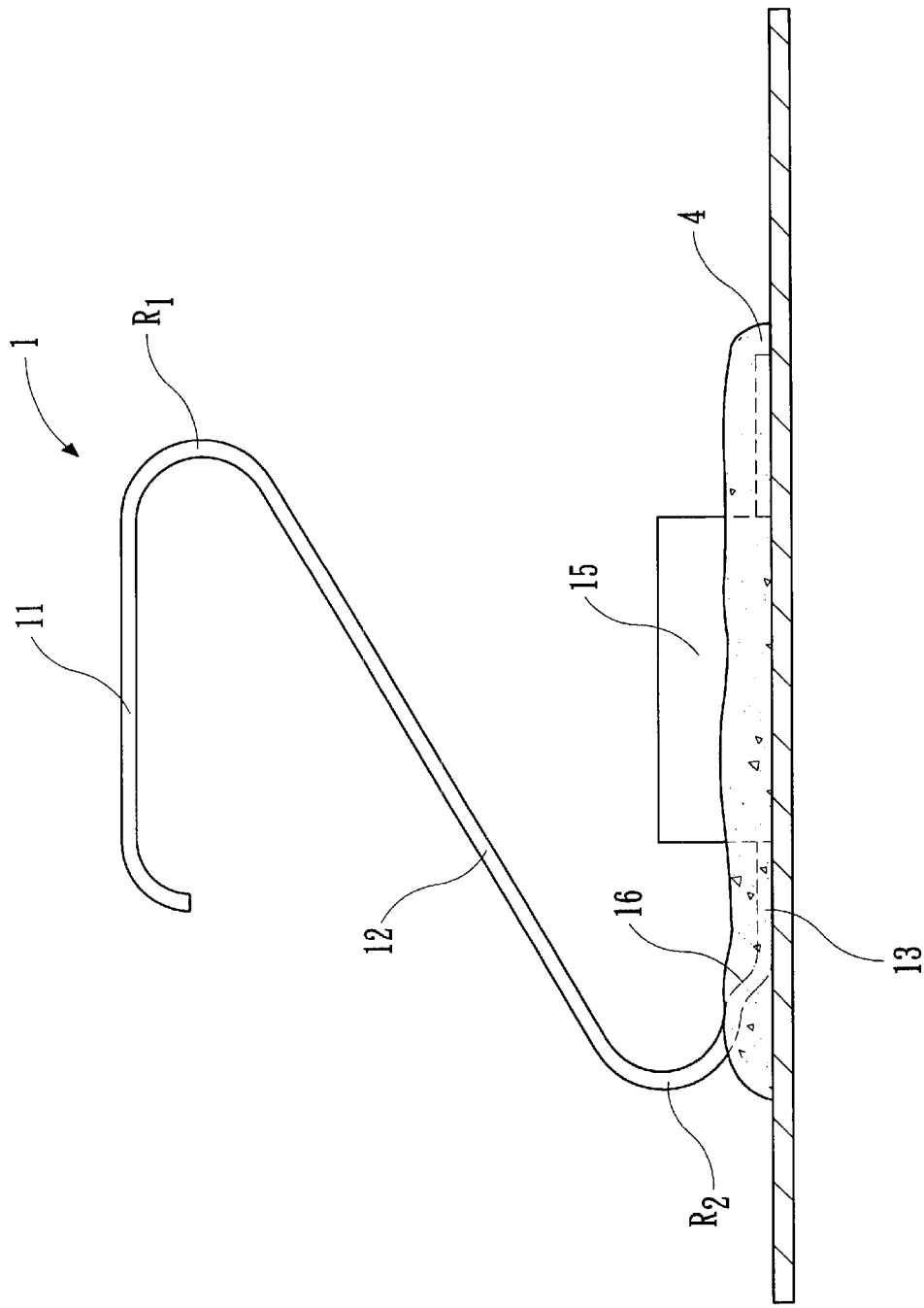
FIG. 10 is a lateral view showing a single elastic conductive piece of the present invention mounted to a computer mother board.

Referring to FIG. 8, an illustrative application wherein a plurality of the elastic conductive pieces are joined to a computer mother board is shown. A plurality of elastic conductive pieces 1 arranged on the peripheries of the microprocessor and memory of the computer mother board.

Spaces between the elastic pieces 1 are determined according to the expected function of the microprocessor. In general, for a microprocessor with lower processing capability, the spacing between adjacent elastic conductive pieces is preferably 2 cm. For a microprocessor of high processing capability, the spacing between adjacent elastic conductive pieces 1 is preferably 1.5 cm. The actual spacing may be determined by checking the typical EMI levels encountered during operation. A cover 2 is installed on the contact surfaces 11 of the elastic conductive pieces 1 to shield the electromagnetic waves resulting during operation of the microprocessor and memory.

Figure 11:
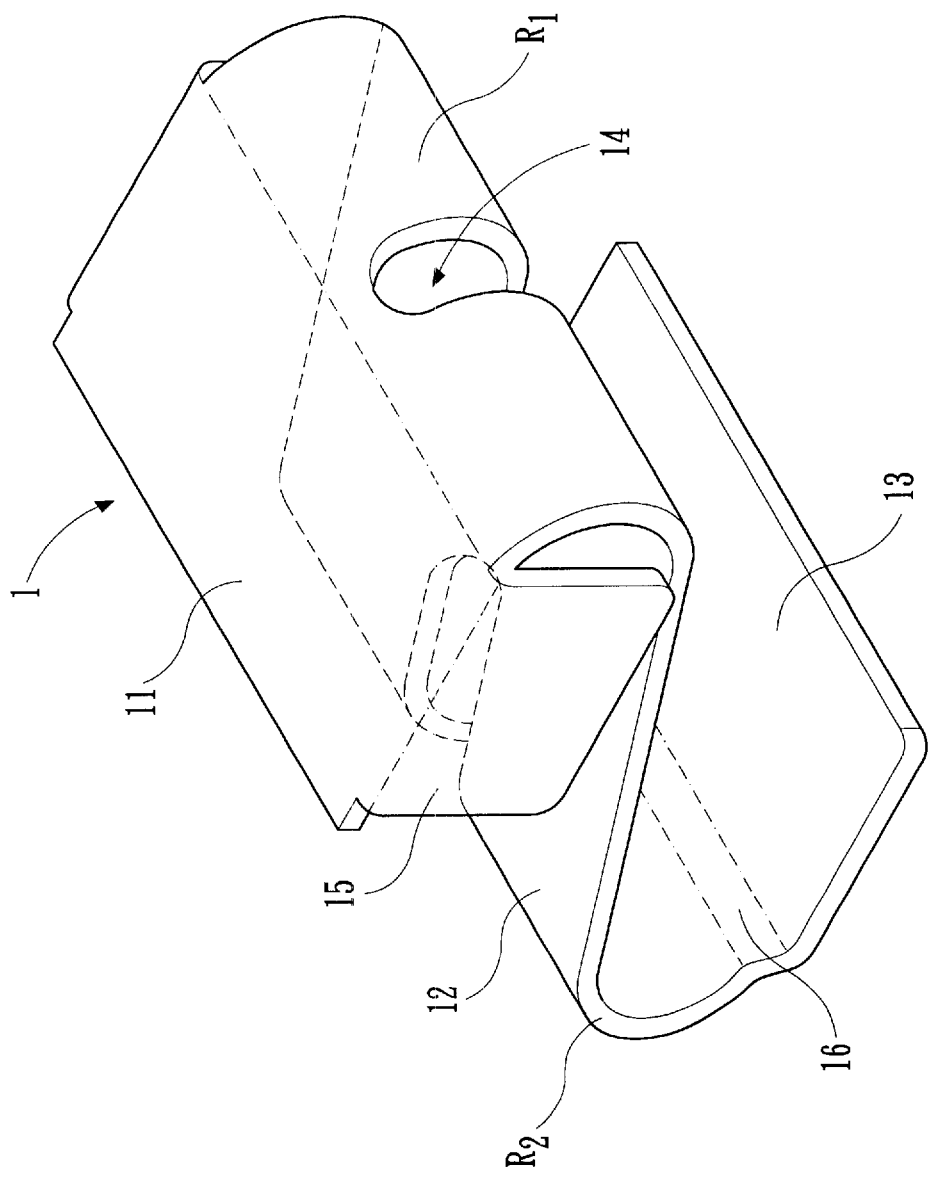
FIG. 11 is a perspective view of another embodiment of the elastic conductive piece of the present invention.

Referring to FIG. 11, another embodiment of the elastic conductive piece is illustrated. In this embodiment, a plate 12 extends downward from an outer lateral end of the contact surface 11, with a first arc portion R1 formed therebetween. A hole 14 is punched at the center of the first arc portion R1. Two lateral sides of the contact surface 11 leading to the first arc portion R1 are bent downward to form upright lateral plates 15. The distal end of the plate 12 extends downward to a second arc portion R2 that leads to a welding surface 13. An enhancing portion 16 is bent between the second arc portion R2 and the welding surface 13. The inner surface of the second arc portion R2 is opposite in orientation to the inner surface of the first arc portion R1.

As the elastic conductive piece 1 is pressed downward, the force applied to the joined second arc portion R2, welding surface 13, and tin glue material is sufficiently accommodated. Thus, breakage or separation of the joined portions is avoided. Accordingly, the present invention overcomes the prior art shortcomings which would permit breakage and separation to occur at the joint of a second arc portion R2, welding surface 13, and tin glue material.

Although the present invention has been described with reference to the preferred embodiments, it will be understood that the invention is not limited to the details thereof described. Various substitutions and modifications have been suggested in the foregoing description, and others will occur to those of ordinary skill in the art. Therefore, all such substitutions and modifications are intended to be embraced within the scope of the Invention as defined in the appended Claims.

What is claimed is:

1. An apparatus for mitigating electromagnetic interference of an electronic unit comprising:

(a) a cover member for the electronic unit;

(b) at least one elastic conductive piece for resiliently supporting said cover member over a support surface, said elastic conductive piece including:

(1) a contact surface portion;

(2) an intermediate plate portion longitudinally offset from said contact surface portion;

(3) a first arc portion extending arcuately between said contact surface and intermediate plate portions;

(4) a welding surface portion longitudinally offset from said intermediate plate portion;

(5) a second arc portion extending arcuately between said intermediate plate and welding surface portions, said second arc portion being disposed substantially in opposite orientation relative to said first arc portion, said second arc portion including an enhancing portion defining a bend extending laterally thereacross for resilience augmentation; and, (c) a tin glue material applied to said welding surface portion for affixing said elastic conductive piece to the support surface.

2. The apparatus as recited in claim 1 wherein said bend of said enhancing portion is disposed adjacent said welding surface portion and describes a downward angled sectional contour.

3. The apparatus as recited in claim 1 wherein said enhancing portion includes an inclined surface extending from said bend.

4. The apparatus as recited in claim 3 wherein said inclined surface extends downward to said welding surface portion from said bend.

5. The apparatus as recited in claim 4 wherein said inclined surface is offset in angular orientation from said welding surface portion by approximately 45 degrees.

6. The apparatus as recited in claim 1 wherein said elastic conductive piece is resiliently biased to a preset configuration, said enhancing portion of said second arc portion in said preset configuration being spaced from the support surface by approximately 0.2 mm.

7. The apparatus as recited in claim 1 wherein said elastic conductive piece further includes a pair of lateral plates extending longitudinally from a pair of laterally opposed sides of said welding surface portion.

8. The apparatus as recited in claim 1 wherein said first arc portion has formed in a laterally intermediate part thereof a longitudinally extended groove.

* * * * *